United States Patent
Hackett

[11] Patent Number: 6,087,585
[45] Date of Patent: Jul. 11, 2000

[54] MICRO-DIMENSIONAL COUPLING CONDUCTOR

[75] Inventor: LeRoy H. Hackett, Woodland Hills, Calif.

[73] Assignee: Hughes Electronics Corporation, El Segundo, Calif.

[21] Appl. No.: 08/844,018

[22] Filed: Apr. 18, 1997

Related U.S. Application Data

[62] Division of application No. 08/448,903, May 24, 1995, Pat. No. 5,663,095.

[51] Int. Cl.[7] .................................... H01L 23/02
[52] U.S. Cl. .................. 174/52.4; 174/117 FF; 174/126.1
[58] Field of Search .................. 257/728, 736, 257/674, 669, 784, 781; 174/117 FF, 126.1, 250; 428/573, 574

[56] References Cited

U.S. PATENT DOCUMENTS

| | | | |
|---|---|---|---|
| 5,276,423 | 1/1994 | Breit et al. ................ | 338/308 |
| 5,668,410 | 9/1997 | Yamamoto ................ | 257/737 |
| 5,704,593 | 1/1998 | Honda ...................... | 257/668 |

OTHER PUBLICATIONS

D. V. Morgan and K. Board, *An Introduction to Semiconductor Microtechnology* (*Second Edition*), John Wiley & Sons, Chichester (1990), pp. 111–114.

*Primary Examiner*—Kristine Kincaid
*Assistant Examiner*—Hung V Ngo
*Attorney, Agent, or Firm*—V. D. Duraiswamy; M. W. Sales

[57] ABSTRACT

A micro-dimensional coupling conductor with a shape that is customized for a particular electronic device. A fabrication method is used in which the physical dimensions of the conductor are precisely controlled with photolithographic techniques, resulting in a conductor that is more precisely tuned to the operating frequency of the device. The conductor is fabricated on an $SiO_2$ substrate using vacuum deposition techniques. After fabrication, the conductor is separated from the $SiO_2$ substrate by dissolving the $SiO_2$. Alternatively, the conductor may be fabricated on a Teflon™ substrate. The use of a Teflon substrate allows a user to remove the conductor from the substrate by applying a small mechanical force to the conductor.

4 Claims, 4 Drawing Sheets

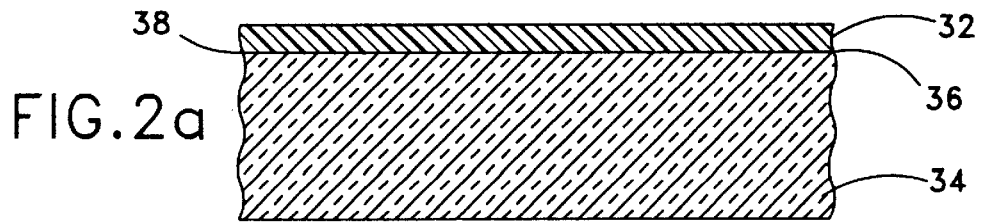
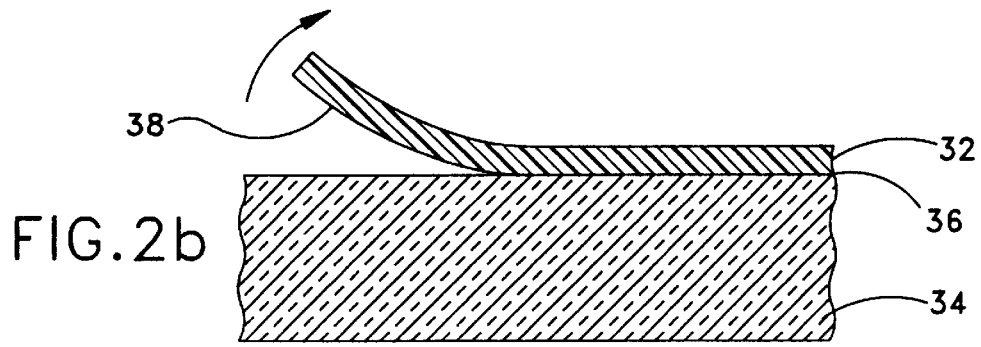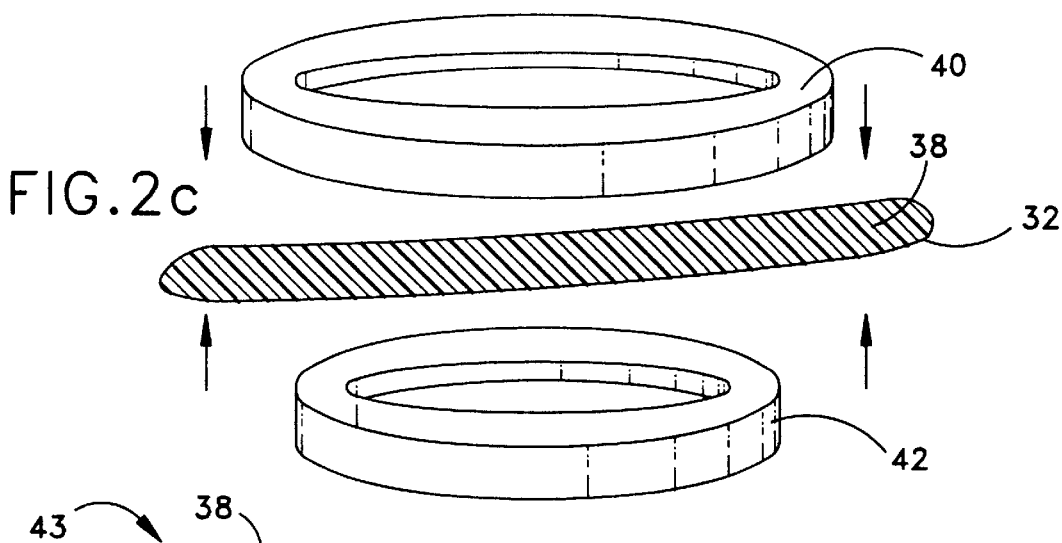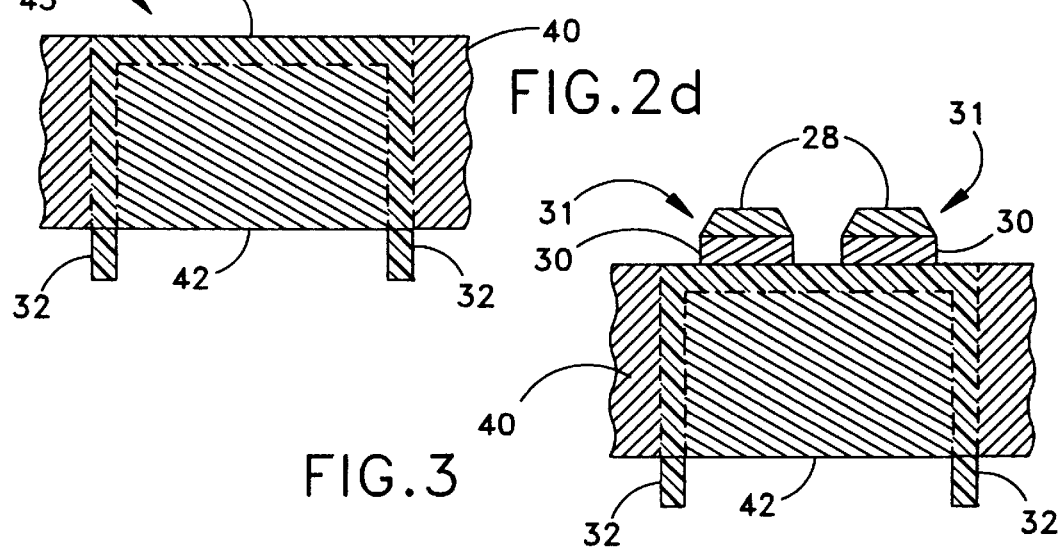

MICRO-DIMENSIONAL COUPLING CONDUCTOR

This is a division of application Ser. No. 08/448,903 filed May 24, 1995, now U.S. Pat. No. 5,663,095.

BACKGROUND OF THE INVENTION

1. Field of the Invention

This invention relates to micro-conductors and more specifically to a method of fabricating customized micro-conductors.

2. Description of the Related Art

Microelectronic fabrication techniques are used to electrically connect integrated circuits (ICs) to the terminals of the electronic packages on which they are mounted.

The most common technique used is "wire bonding", in which fine aluminum or gold wires are used to make electrical contact between the metallized pads of an integrated circuit (IC) and the electronic terminals of the package. The wires are bonded one at a time, with each wire requiring two bonds (one at the IC and the other at the electronic terminal). Wire bonding techniques include thermocompression bonding, ultrasonic bonding and thermosonic bonding and are discussed in D. V. Morgan and K. Board, *An Introduction to Semiconductor Microtechnology* (Second Edition), John Wiley & Sons, Chichester (1990), pages 111–114.

In some microelectronic device structures, the wire bonding method does not provide adequate electrical connections between the IC and the package terminals. For example, devices that operate at microwave frequencies require large surface area conductors with precisely defined shapes and sizes to operate properly. These requirements arise from the inductance affects encountered at microwave frequencies. The wires used in wire bonding are fabricated in bulk at fixed diameters that typically range between 0.18 and 1.27 mm. To achieve the large surface area required for microwave devices, multiple wires are bonded between the metallization pattern on the IC and the package terminal, increasing the conductive surface area between the IC and the package terminals. However, since the wires are prefabricated to standard diameters, it is very difficult to precisely "tune" the total conductor surface area to the device operating frequency.

A prior alternative technique for microwave devices utilizes a metal "ribbon" between the metallization pattern on the IC and the package terminals. Like the wires described above, metal ribbons are manufactured in bulk at various fixed widths and thicknesses. To achieve a customized (tuned) connection between the IC and the package terminals, the metal ribbons must be tediously cut by hand (usually with an EXACTO™ knife) to the precise shape and size needed. The hand-cut conductors exhibit ragged edges which adversely affect the performance of the microwave device and lack consistency from assembly to assembly.

SUMMARY OF THE INVENTION

In view of the above problems, the present invention provides a method of fabricating bulk micro-dimensional coupling conductors with shapes and sizes that can be easily customized for a particular device. Unlike prior hand-cut conductors, the physical dimensions of the conductors fabricated with the present method are precisely controlled with photolithographic techniques, resulting in conductors that are more precisely tuned to the operating frequency of the device.

The conductors are fabricated by growing a smooth material layer, such as $SiO_2$ on a semiconductor substrate, and vacuum depositing a thin metal layer, such as gold, onto the $SiO_2$ layer. A photoresist mask, with openings that define the shape and thickness of the conductors, is fabricated on the gold layer. An "image reversal" process is used in the fabrication of the photoresist mask using a clear field glass mask for pattern transfer, causing the photoresist to remain in the field or majority areas. This process produces an undercut of the top resist edge. Electrically conductive material, such as gold, is electroplated into the photoresist openings. Sequential layers of different types of conductive materials (such as gold/rhodium/gold) may be plated to customize the electrical and mechanical properties of the conductors. The photoresist mask is then removed by chemical or photochemical means and the portions of the thin gold layer that are not covered by plated conductive material are removed by ion milling, resulting in a plurality of individual electrical conductors on an $SiO_2$ layer. The conductors can remain on the semiconductor substrate until they are needed, at which time they are separated from the substrate by dissolving the $SiO_2$ layer with acetone.

Alternatively, the conductors may be fabricated on a Teflon™ substrate. The thin gold layer is deposited directly onto the Teflon substrate and the conductors are fabricated through a photoresist mask as described above.

The use of a Teflon substrate allows a user to individually remove conductors from the substrate by applying a small mechanical force to the conductor. In contrast, conductors fabricated using the first method described above must all be removed from the substrate simultaneously by dissolving the underlying $SiO_2$ layer.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 2*a* and 2*b* are cross-sectional views illustrating successive steps in the fabrication of a Teflon substrate.

FIG. 2*c* is an exploded perspective view of a Teflon substrate holder.

FIG. 2*d* is a cross-sectional view of the Teflon substrate holder of FIG. 2*c* in an assembled position.

FIG. 3 is a cross-sectional view of completed coupling conductors on a Teflon substrate.

DETAILED DESCRIPTION OF THE INVENTION

Figure 1A:
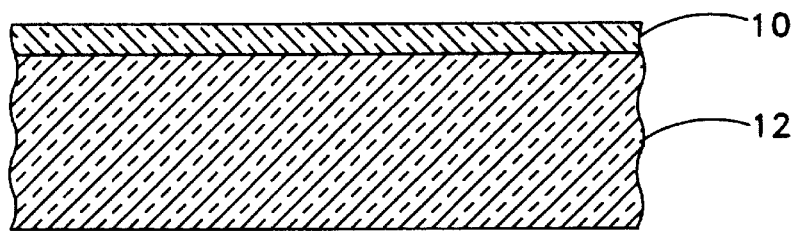
FIGS. 1*a*–1*h* are cross-sectional views illustrating successive steps in the micro-dimensional coupling conductor fabrication method of the present invention.
Figure 1B:
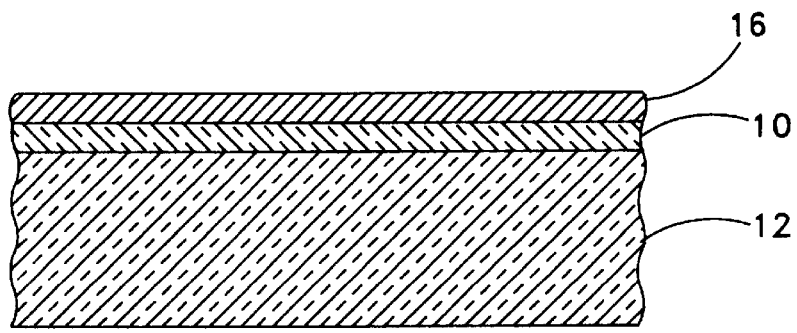
Figure 1C:
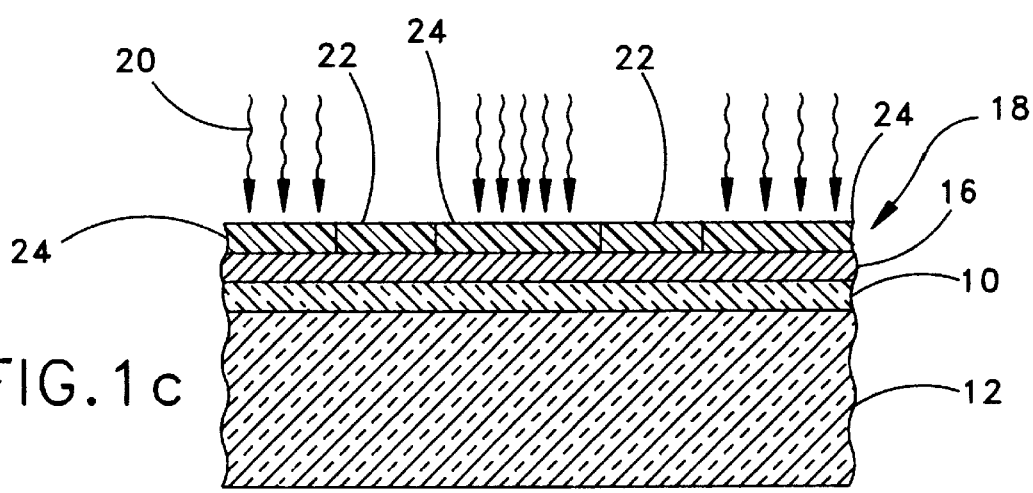
Figure 1D:
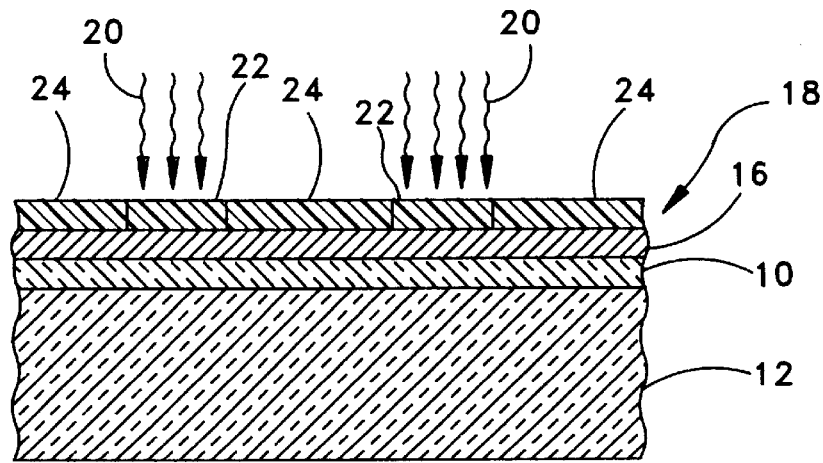
Figure 1E:
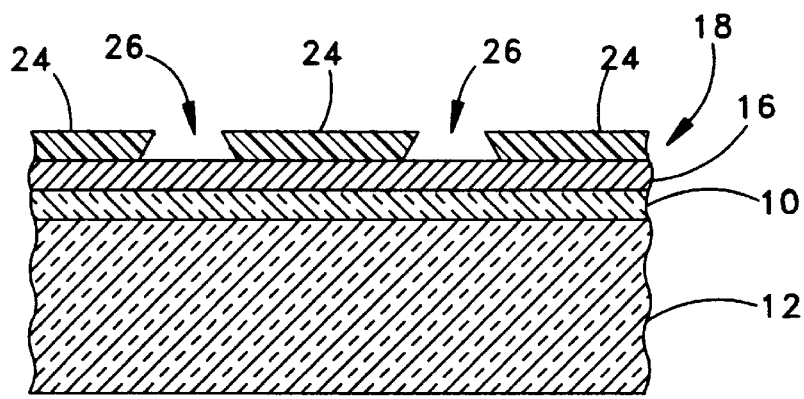

FIGS. 1*a*–1*h* illustrate the preferred fabrication method for the micro-dimensional coupling conductors. Initially, as shown in FIG. 1*a*, a smooth material layer 10, preferably between 1 and 2 microns thick, is deposited on a semiconductor substrate 12. The substrate 12 is preferably a 2 or 3 inch silicon wafer of common thickness (preferably 0.02 inches). The smooth material layer 10 is preferably composed of a material that has a smooth surface and that is compatible with semiconductor fabrication techniques. In the preferred embodiment, an $SiO_2$ layer 10 is grown onto or from the silicon substrate 12 using standard thermal oxidation techniques.

In the next step (FIG. 1b), a thin layer of metal 16, preferably a 100 nm layer of gold, is vacuum deposited onto the $SiO_2$ layer 10. In the preferred embodiment, a 30 nm layer of titanium (not shown) is deposited before the gold layer 16 to improve the adhesion between the gold layer 16 and the $SiO_2$ layer 10.

The next step (FIG. 1c) consists of laying down a layer of positive photoresist 18 over the gold layer 16. The thickness of the photoresist layer 18 is equal to the thickness of the eventual coupling conductors, and can thus be tailored to achieve a specific coupling conductor thickness The photoresist layer 18 is exposed to ultraviolet (UV) light 20 using standard photolithographic techniques, except for portions 22 of the photoresist layer 18 that are masked with standard photomasking techniques. The portions 22 define the location of the eventual coupling conductors and are shaped so that the eventual coupling conductors are tuned to the operating frequency of the device in which they will be used.

The photoresist 18 is then placed in an oven (not shown) and baked at a temperature of 100 degrees Celsius in an $NH_4OH$ atmosphere for approximately 0.5 hours. This forms an $NH_4OH$ concentration gradient in the photoresist layer 18. The $NH_4OH$ combines with the UV exposed photoresist portions 24 and chemically alters the portions 24 so that their solubility in a photoresist developer is inversely proportional to the $NH_4OH$ concentration.

In the next two steps (FIGS. 1d–1e), the non-UV-exposed photoresist portions 22 are exposed to UV light 20 using standard photomasking and photolithographic techniques. The photoresist is then developed. The solubility of photoresist portions 24 increase as a function of layer depth due to the $NH_4OH$ gradient. As a result, openings 26 are created in the photoresist layer 18 with widths that increase as a function of the photoresist layer 18 depth.

Figure 1F:
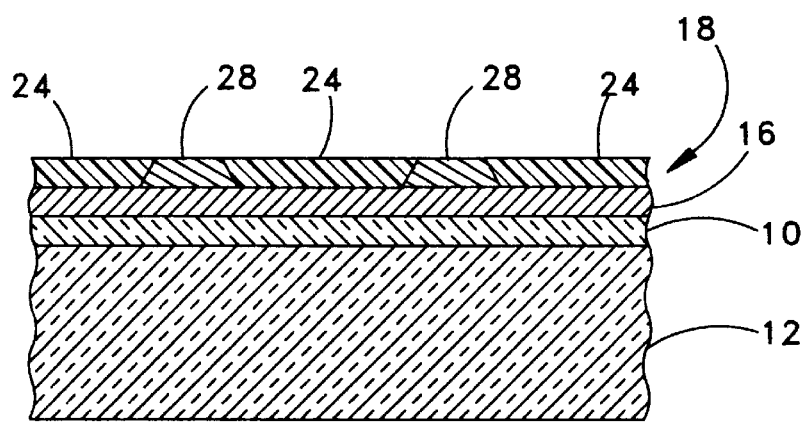
Figure 1G:
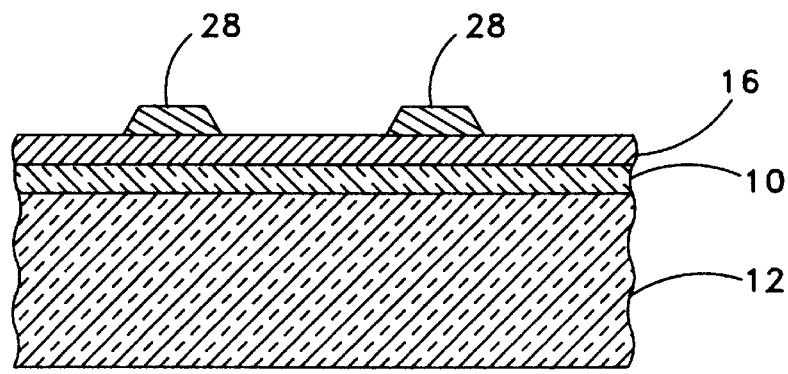
Figure 1H:
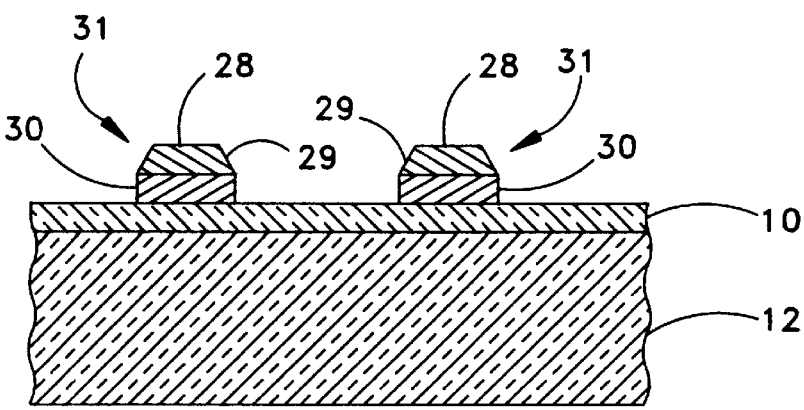

In FIG. 1f, metal 28 is deposited in the openings 26 in the photoresist layer 18, preferably to the same thickness as the photoresist layer 18. In the preferred embodiment, standard electroplating techniques are used to deposit the metal 28. A single layer of gold is preferably electroplated but any other metal, such as copper or silver, may be used. In addition, sequential layers of different types of metals (such as gold/rhodium/gold) may be electroplated to customize the electrical and mechanical properties of the conductors. The chemically altered photoresist portions 24 are then removed, leaving behind the shaped metal layers 28 on top of the thin gold layer 16, as illustrated in FIG. 1g. The photoresist portions are preferably removed with acetone, but other chemical or plasma decomposition means may be used.

In the next step (FIG. 1h), the gold layer 16 (and its underlying titanium layer) is removed except for the portions 30 that are covered by the shaped metal layers 28. The gold layer is preferably removed using standard ion milling techniques. The ion milling (preferably using argon gas) removes the 100 nm thick gold layer 16 (and its underlying 30 nm titanium layer) and also removes a corresponding amount of metal (100 nm) from the top of the shaped metal layers 28. The outwardly sloped sides 29 of the shaped metal layers 28 allow the ions to cut the thin gold layer 16 into portions 30 that are approximately as wide as the widest portion of the shaped metal layer 28 (the portions 30 extend to the edge of the shaped metal layers 28). If the shaped metal layers 28 did not have outwardly sloped sides 29, the tops of the metal layers 28 could "shadow" portions of the thin gold layer from the ions, resulting in gold layer portions 30 that are wider than the bottoms of the shaped metal layers 28. The overhanging gold layer portions could tear off during use and contaminate the device.

The isolated shaped metal layers 28 and gold layer portions 30 comprise the micro-dimensional coupling conductors 32. The conductors 32 can remain on the silicon substrate 12 until they are needed, at which time they are separated from the silicon substrate by dissolving the $SiO_2$ layer 10. The $SiO_2$ layer 10 is preferably dissolved with hydroflouric acid and/or with ammonium biflouride as a buffer, which also dissolves the 30 nm titanium layer (not shown) between the $SiO_2$ layer 10 and the gold layer portions 30.

Alternatively, the coupling conductors may be fabricated on a flat Teflon substrate. FIGS. 2a–2d illustrate the preferred method of manufacturing a flat Teflon substrate. In the first step (FIG. 2a) a layer of Teflon 32, preferably Dupont™ Clear FEP Liquid (Part # 856-200), is applied to a silicon substrate 34, preferably a 2 or 3 inch silicon wafer of common thickness (preferably 0.02 inches thick) with a surface 36 that has been polished to a mirror finish. The Teflon layer 32 is allowed to cure so that the side 38 of the Teflon layer 32 that is in mechanical contact with the polished silicon substrate surface 36 cures in the shape of the polished substrate surface 36. After the Teflon layer 32 cures, it is mechanically lifted off the silicon substrate 34, as illustrated in FIG. 2b. The Teflon layer 32 may be lifted off with tweezers.

In the next step (FIG. 2c), the Teflon layer 32 is placed between two annular rings 40 and 42, preferably made of aluminum. One ring 40 has an inner diameter that is slightly larger than the outer diameter of the second ring 42. The difference between the inner diameter of ring 40 and the outer diameter of ring 42 should be approximately equal to the thickness of the Teflon layer 32 so that, when the rings are pressed together, the smaller ring 42 fits inside the larger ring 40, with the Teflon layer 32 pinched between the two rings, as illustrated in FIG. 2d. The pinching of the Teflon layer 32 between the rings causes a portion 42 of the Teflon layer 32 to be stretched taut. The flat side 38 of the Teflon layer 32 is used as the substrate on which the coupling conductors are fabricated.

The coupling conductors are fabricated on the Teflon substrate surface 38 using the same fabrication steps illustrated in FIGS. 1b–1h, with the substitution of the Teflon layer 32 for the $SiO_2$ layer 10. Unlike the $SiO_2$ process, a thin titanium layer is not used between the Teflon layer 32 and the thin gold layer 16. FIG. 3 illustrates the completed coupling conductors 31 on the flat Teflon surface 38. Since the Teflon surface 38 is a replica of the polished silicon substrate surface, it is very smooth. This results in a very weak mechanical bond between the gold layer portions 30 and the Teflon surface 38. As a result, the individual conductors 31 may be removed from the Teflon surface 38 by applying a slight mechanical force to the conductor 31. In this way, individual conductors 31 may be removed as needed. In contrast, conductors fabricated on $SiO_2$ must all be removed from the silicon substrate simultaneously by dissolving the underlying $SiO_2$ layer. The conductors must then be stored and dispensed in bulk.

Figure 4:
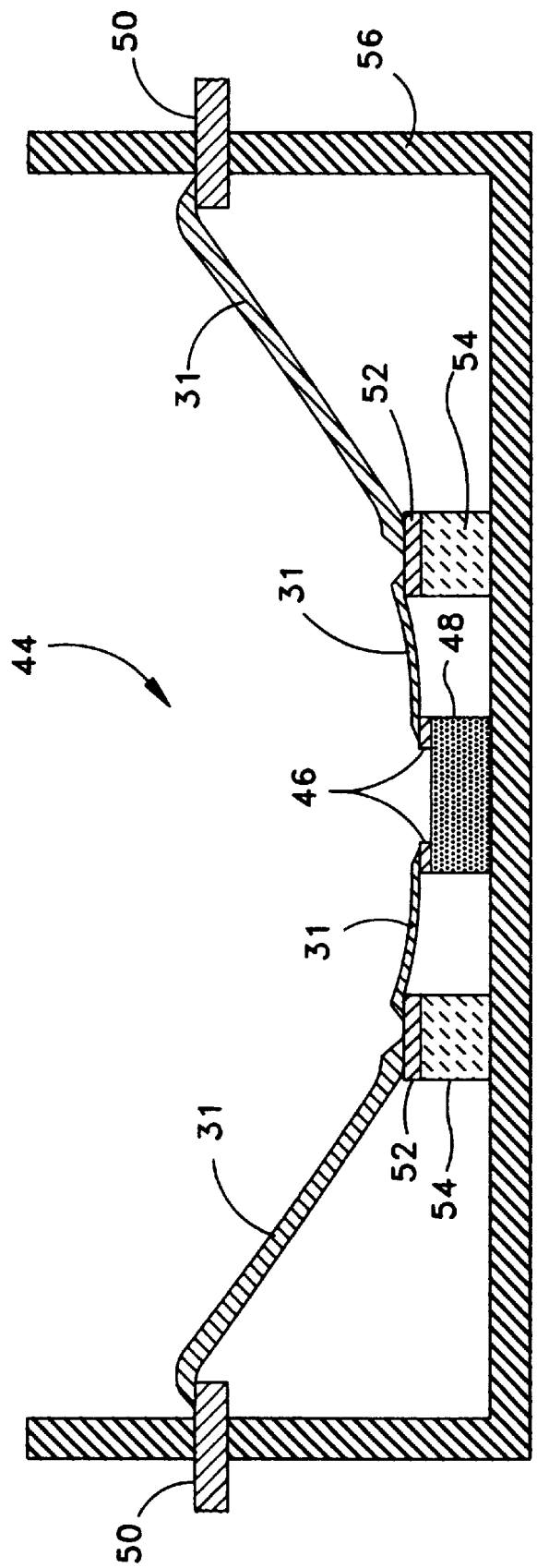
FIG. 4 is a cross-sectional view illustrating the use of the present coupling conductors in a typical microwave device.

Conductors 31 fabricated with either the $SiO_2$ process or the Teflon process are shaped so that they are compatible with the tune of the frequency of the device in which they are used. FIG. 4 illustrates how the conductors 31 are utilized in a typical microwave package 44 (the structure depictions are not drawn to scale). The conductors 31 are used to provide electrical connections between the contact pads 46 of a microelectronic integrated circuit (IC) or discreet device that has been fabricated on a semiconductor chip 48 and the external leads 50 of the package 44.

Electrical connections are typically made to intermediate electrical terminals 52, or passive devices such as capacitors, that are mounted on ceramic substrates 54, and then to the external leads 50 using separate conductors 31. The conductors 31 are preferably attached to the contact pads 46, intermediate terminals 52 and external leads 50 using standard thermocompression bonding or parallel gap welding methods. The package housing 56 is typically made of goldplated Kovar™, ceramic, or plastic. For illustration, the housing 56 in FIG. 4 is made of an electrical insulator. If an electrically conductive material is used for the housing 56, electrically insulating sleeves (not shown) would need to be used to electrically isolate the external leads 50 from the housing 56.

Numerous other variations and alternate embodiments will occur to those skilled in the art without departing from the spirit and scope of the invention. For example, the use of multiple metal layers in the fabrication of the conductors allow for the tailoring of the electrical, mechanical and chemical properties of the conductor material. In addition to their use as conductors, these tailored materials could be applied to other mechanical or structural applications. Accordingly, it is intended that the invention be limited only in terms of the appended claims.

I claim:

1. A micro-dimensional coupling conductor, comprising:
   a first conductive material layer having a rectangularly shaped cross-section; and
   a second conductive material layer disposed on said first layer having a cross-sectional width that narrows as a function of distance from the interface between said first and second layers, wherein the cross-sectional width of said second layer is equal to the cross-sectional width of said first layer at the interface between said first and second layers.

2. The conductor of claim 1 wherein said first and second layer are made of a common material.

3. An electronic package, comprising:
   an electrical device,
   a housing for holding said electrical device,
   an external lead extending from said housing, and
   a coupling conductor for electrically connecting said electrical device to said external lead,
   said coupling conductor comprising a first conductive material layer having a rectangularly shaped cross-section and a second conductive material layer disposed on said first layer having a cross-sectional width that narrows as a function of distance form the interface between said first and second layers,
   wherein the cross-sectional width of said second layer is equal to the cross-sectional width of said first layer at the interface between said first and second layers.

4. The package of claim 3, wherein said first and second layers are made of a common material.

* * * * *